(12) United States Patent
Takuma

(10) Patent No.: US 10,095,512 B2
(45) Date of Patent: Oct. 9, 2018

(54) PROGRAM DEVELOPMENT SUPPORT DEVICE, NON-TRANSITORY STORAGE MEDIUM STORING THEREON COMPUTER-READABLE PROGRAM DEVELOPMENT SUPPORT PROGRAM, AND PROGRAM DEVELOPMENT SUPPORT METHOD

(71) Applicant: OMRON Corporation, Kyoto-shi, Kyoto (JP)

(72) Inventor: Nobuyuki Takuma, Kusatsu (JP)

(73) Assignee: OMRON CORPORATION, Kyoto-shi, Kyoto (JP)

( * ) Notice: Subject to any disclaimer, the term of this patent is extended or adjusted under 35 U.S.C. 154(b) by 0 days.

(21) Appl. No.: 15/407,506

(22) Filed: Jan. 17, 2017

(65) Prior Publication Data
US 2017/0262278 A1    Sep. 14, 2017

(30) Foreign Application Priority Data

Mar. 14, 2016 (JP) ................................ 2016-049247

(51) Int. Cl.
| | | |
|---|---|---|
| G06F 9/44 | (2018.01) | |
| G06F 8/73 | (2018.01) | |
| G05B 19/042 | (2006.01) | |
| H03M 13/09 | (2006.01) | |

(52) U.S. Cl.
CPC ........... *G06F 8/73* (2013.01); *G05B 19/0426* (2013.01); *G05B 2219/13129* (2013.01); *G05B 2219/23009* (2013.01); *H03M 13/09* (2013.01)

(58) Field of Classification Search
None
See application file for complete search history.

(56) References Cited

U.S. PATENT DOCUMENTS

| | | | | |
|---|---|---|---|---|
| 5,359,659 | A * | 10/1994 | Rosenthal ............. | G06F 21/564 726/24 |
| 2003/0028774 | A1* | 2/2003 | Meka ..................... | H04L 9/3231 713/176 |
| 2005/0005224 | A1* | 1/2005 | Ridgeway ........... | H03M 13/091 714/758 |

(Continued)

FOREIGN PATENT DOCUMENTS

| | | |
|---|---|---|
| EP | 0 323 707 A2 | 7/1989 |
| EP | 1 577 759 A2 | 9/2005 |
| JP | 2015-018553 A | 1/2015 |

OTHER PUBLICATIONS

Communication dated Aug. 3, 2017 from the European Patent Office in counterpart application No. 17151107.4.

*Primary Examiner* — Philip Wang
(74) *Attorney, Agent, or Firm* — Sughrue Mion, PLLC

(57) ABSTRACT

A program development support device for supporting development of a safety program to be executed in a safety controller includes: a development module that develops the safety program in response to user operation; a calculation module that calculates an identification value according to data of the developed safety program, in accordance with a function for calculating a random value with respect to an input; and an output module that outputs a document related to the safety program. The output module provides the identification value calculated by the calculation module to all pages of the document which are related to the safety program.

12 Claims, 7 Drawing Sheets

(56) References Cited

U.S. PATENT DOCUMENTS

| | | | |
|---|---|---|---|
| 2005/0188015 A1* | 8/2005 | Attwell | H04L 12/2854 709/205 |
| 2006/0143594 A1* | 6/2006 | Grimaldi | G06F 8/73 717/123 |
| 2008/0250394 A1* | 10/2008 | Jones | G06F 8/73 717/123 |
| 2014/0046457 A1 | 2/2014 | Taber et al. | |
| 2014/0223580 A1* | 8/2014 | Neivanov | G06F 21/12 726/28 |

* cited by examiner

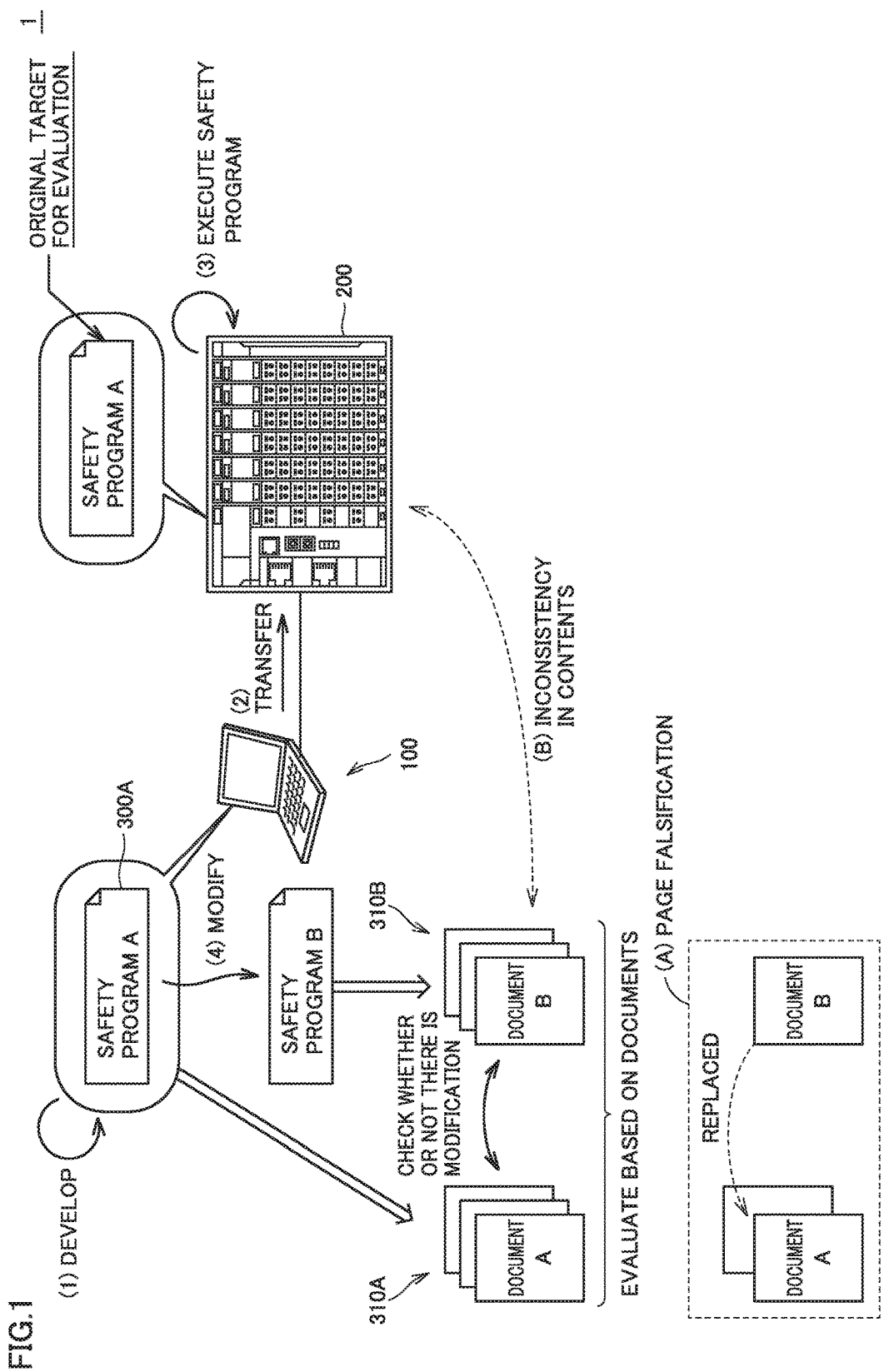

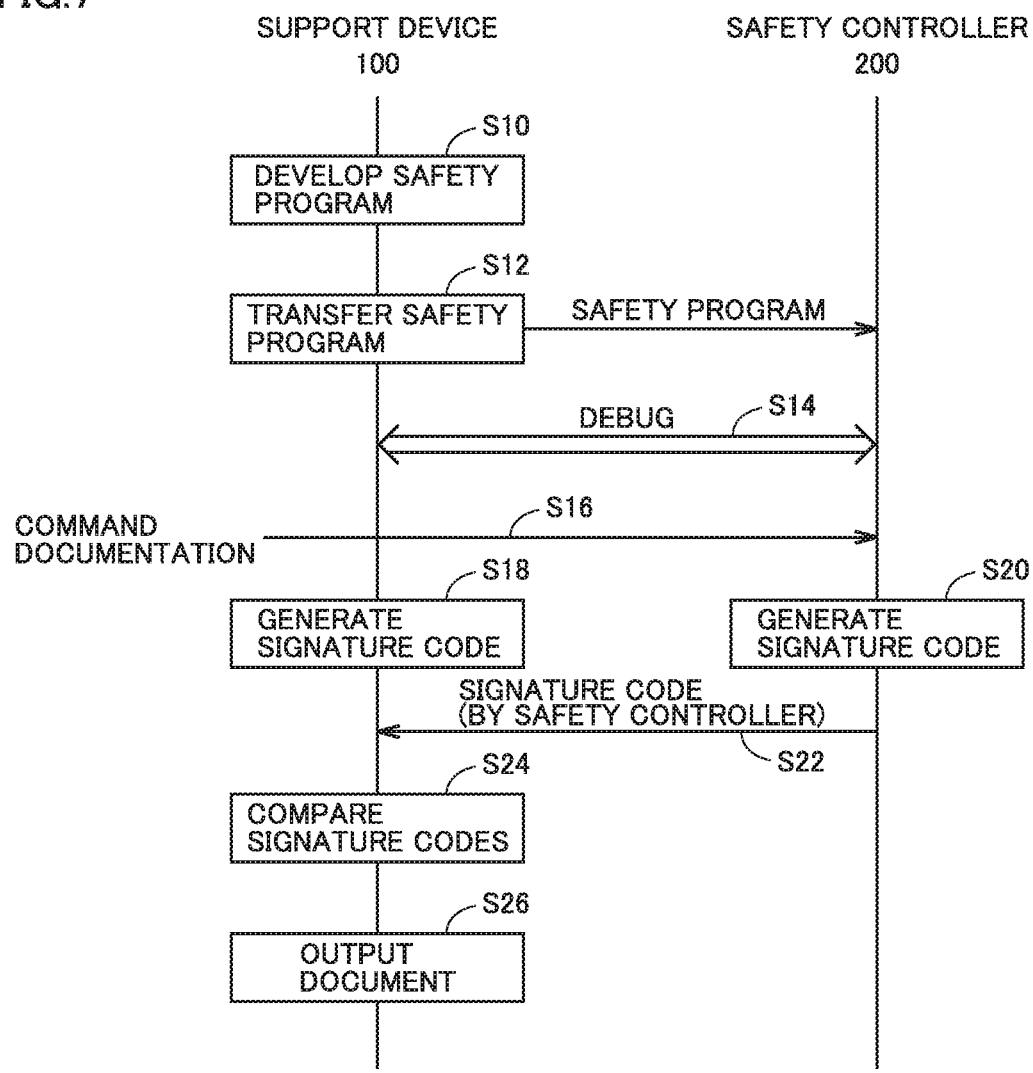

PROGRAM DEVELOPMENT SUPPORT DEVICE, NON-TRANSITORY STORAGE MEDIUM STORING THEREON COMPUTER-READABLE PROGRAM DEVELOPMENT SUPPORT PROGRAM, AND PROGRAM DEVELOPMENT SUPPORT METHOD

BACKGROUND OF THE INVENTION

Field of the Invention

The present technique relates to a program development support device, a non-transitory storage medium storing thereon a computer-readable program development support program, and a program development support method for supporting development of a safety program to be executed in a safety controller.

Description of the Background Art

In order to safely use machines for use at many manufacturing sites, safety equipment (safety components) in compliance with international standards should be used. The safety equipment is intended to prevent people's safety from being threatened by automatically moving devices such as robots. Such safety equipment includes a safety controller which executes a safety program, as well as detection equipment which detects the presence or intrusion of a person, input equipment which receives operation in case of emergency, output equipment which actually stops manufacturing equipment, and the like.

In association with the development of such a safety program, Japanese Patent Laying-Open No. 2015-018553 discloses a configuration of using one or more state machine function blocks which can be easily integrated into a functional block diagram for programming an environment, for a control system and a safety system in a process plant.

A document indicating contents of a safety program is important in evaluating functional safety of an entire system including a safety controller. In particular, after a safety program created on a personal computer or the like is transferred to a safety controller, an operation to directly modify the safety program executed on the safety controller and various settings (typically referred to as "online editing" or the like) may be performed, and there may be a case where the safety program on the safety controller is inconsistent with the safety program on the personal computer. There may also be a case where an output document itself may be falsified. Accordingly, in particular in evaluating functional safety, it is necessary to carefully handle the document.

SUMMARY OF THE INVENTION

Japanese Patent Laying-Open No. 2015-018553 described above merely discloses that the function of a configured state machine function block (SMFB) is easily documented by printing out a representation of a matrix, and does not take the problem as described above into consideration.

Thus, there is a need for a configuration which achieves stricter handling of a document related to a safety program to be executed in a safety controller.

A program development support device for supporting development of a safety program to be executed in a safety controller in accordance with an embodiment includes: a development module that develops the safety program in response to user operation; a calculation module that calculates an identification value according to data of the developed safety program, in accordance with a function for calculating a random value with respect to an input; and an output module that outputs a document related to the safety program. The output module provides the identification value calculated by the calculation module to all pages of the document which are related to the safety program.

The output module may provide the identification value calculated by the calculation module to all pages related to functional safety, of pages constituting the output document.

The calculation module may calculate a first identification value from each of a plurality of data generated by the development module, and calculate a second identification value provided to the document from a plurality of the first identification values.

The calculation module may output a cyclic redundancy check code calculated in accordance with a predetermined generating polynomial, as the identification value.

The output module may output the document under a condition that an identification value calculated from a safety program held in the program development support device is identical to the identification value calculated from the safety program to be executed in the safety controller.

According to an embodiment, a non-transitory storage medium storing thereon a computer-readable program development support program for supporting development of a safety program to be executed in a safety controller is provided. The program development support program causes a computer to execute: developing the safety program in response to user operation; calculating an identification value according to data of the developed safety program, in accordance with a function for calculating a random value with respect to an input; and outputting a document related to the safety program. The outputting includes providing the calculated identification value to all pages of the document which are related to the safety program.

According to an embodiment, a program development support method to be executed in a device for supporting development of a safety program to be executed in a safety controller is provided. The program development support method includes: developing the safety program in response to user operation; calculating an identification value according to data of the developed safety program, in accordance with a function for calculating a random value with respect to an input; and outputting a document related to the safety program. The outputting includes providing the calculated identification value to all pages of the document which are related to the safety program.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a schematic view illustrating an overview of document management for a safety program to be executed in a safety controller in accordance with the present embodiment.

FIG. 7 is a sequence diagram showing a processing procedure for a function of verification in the support device in accordance with the present embodiment.

DESCRIPTION OF THE PREFERRED EMBODIMENTS

Figure 2A:
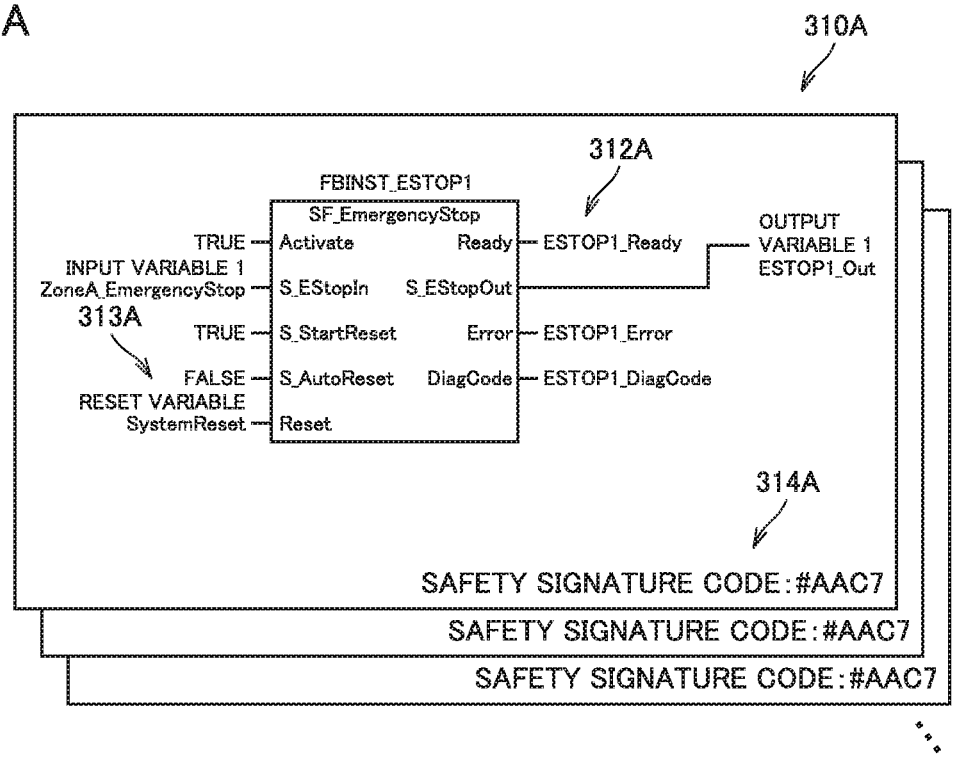
FIGS. 2A, 2B, and 3 are each a schematic view showing an example of a document output from a support device in accordance with the present embodiment.

Embodiments of the present invention will be described in detail with reference to the drawings. It should be noted that identical or corresponding parts in the drawings will be designated by the same reference signs, and the description thereof will not be repeated.

<A. Overview of Document Management>

First, an overview of document management for a safety program to be executed in a safety controller in accordance with the present embodiment will be described with reference to FIG. 1.

Referring to FIG. 1, a safety system 1 including a program development support device (hereinafter also abbreviated as "support device") 100 and a safety controller 200 is assumed as an example. Support device 100 is a device for supporting development of a safety program to be executed in safety controller 200.

In such a safety system 1, a user develops (creates, debugs, and the like) a safety program 300A using support device 100 ((1) DEVELOP). Once the development is completed, the user transfers safety program 300A created in support device 100 to the safety controller ((2) TRANSFER). In safety controller 200, the transferred safety program is executed ((3) EXECUTE SAFETY PROGRAM). It should be noted that, when the safety program is transferred from support device 100 to safety controller 200, a source code of the safety program created in support device 100 may be converted into an executable format (for example, an object format) or the like.

For safety program 300A transferred to safety controller 200 and being executed, a document 310A is generated via support device 100. The document is generated, for example, in a form output by a printer as printed matter, or in a form output as an electronic document such as a PDF (Portable Data Format).

It is assumed that, thereafter, safety program 300A is modified on support device 100 ((4) MODIFY) to create another safety program 300B. Also for safety program 300B, a document 310B can be generated via support device 100.

Essentially, it is necessary to evaluate functional safety on the safety program to be executed in safety controller 200. However, from viewpoints of convenience, objectivity, and the like of evaluation, functional safety is evaluated based on the document output from support device 100, upon confirming that the safety program on support device 100 is identical to the safety program to be executed in safety controller 200.

On the other hand, intentional page falsification, such as replacing some pages of document 310A output from safety program 300A created in support device 100 with corresponding pages of document 310B output from modified safety program 300B, can also be conducted. Alternatively, two types of documents may be mixed by mistake.

Thus, it is necessary to prevent a problem such as falsification of some pages in the document ((A) PAGE FALSIFICATION), or inconsistency between contents of the document and contents of the safety program to be executed in safety controller 200 ((B) INCONSISTENCY IN CONTENTS).

Accordingly, support device 100 in accordance with the present embodiment provides a function which secures the certainty of evaluation of functional safety. More specifically, a document 310 generated from a safety program 300 is provided with an identification value calculated based on data of safety program 300.

Figure 2B:
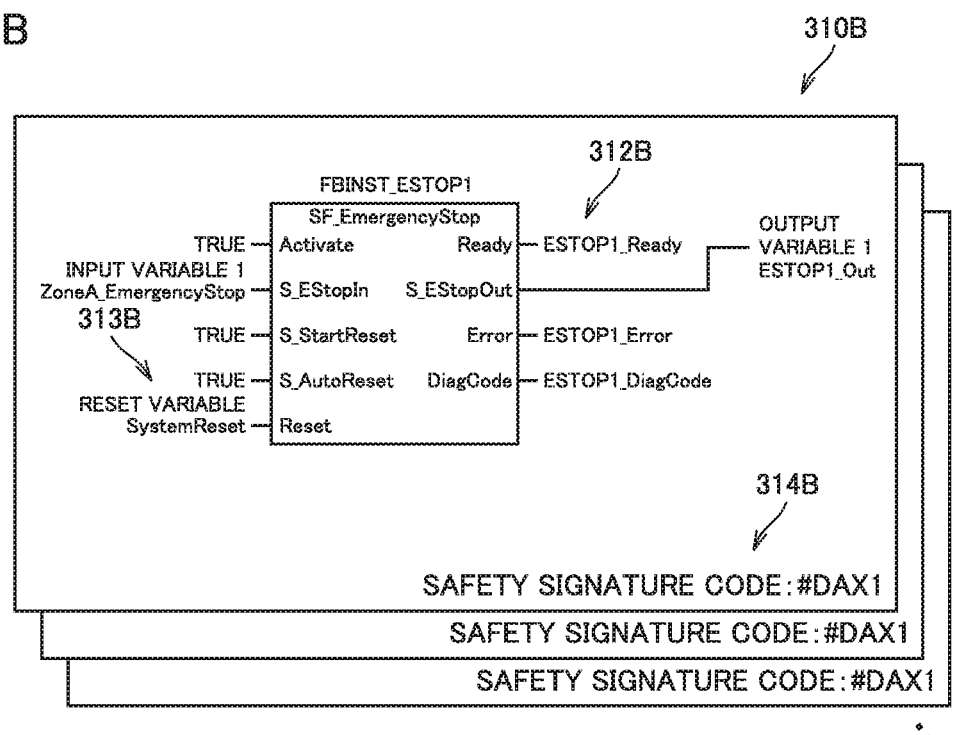
Figure 3:
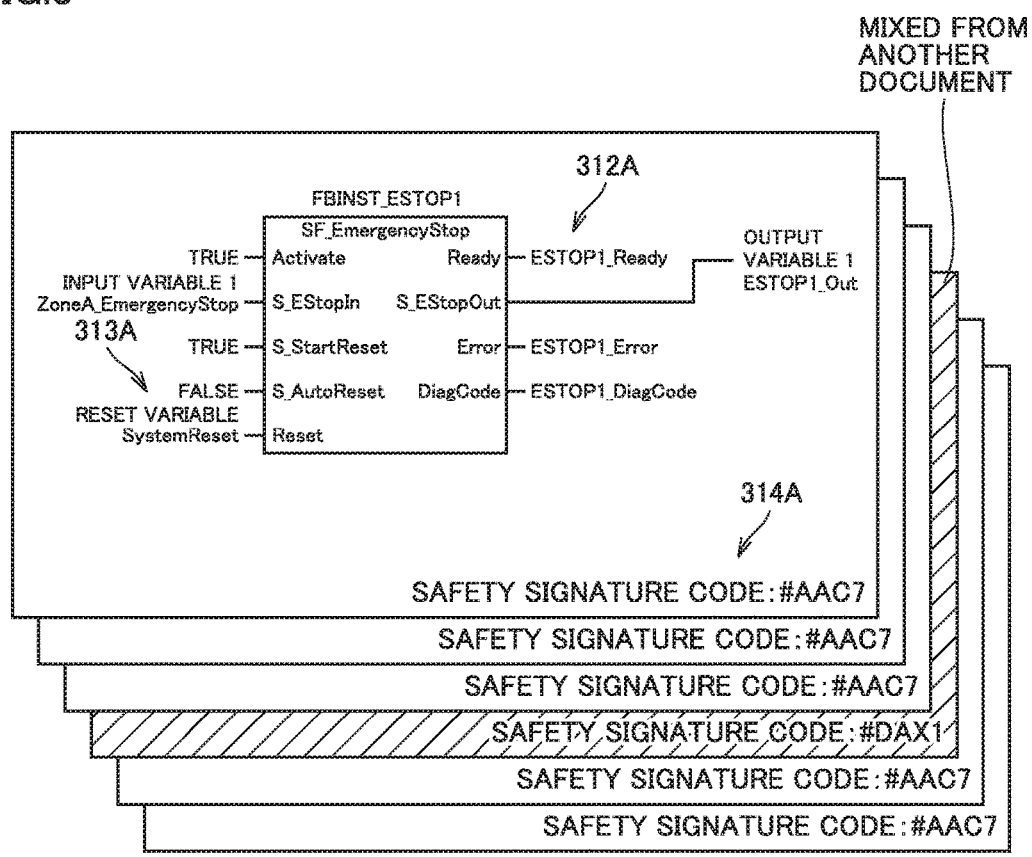

FIGS. 2A, 2B, and 3 each show an example of a document output from support device 100 in accordance with the present embodiment. Referring to FIG. 2A, in document 310A output from safety program 300A, a logic included in safety program 300A is defined using a function block. Further, document 310A is provided with "#AAC7" as a signature code.

On the other hand, in document 310B shown in FIG. 2B, a logic included in safety program 300B is defined using a function block. As an example, "FALSE" is set to "S_AutoReset" (reference sign: 313A) of a function block 312A of safety program 300A, whereas "TRUE" is set to "S_AutoReset" (reference sign: 313B) of a function block 312B of safety program 300B. On this occasion, document 310B is provided with "#DAX1" as a signature code. Thus, the value of the provided signature code is significantly changed even in a case where the safety program is modified only to a slight extent.

A document output by support device 100 in accordance with the present embodiment is provided with a signature code, which is an identification value calculated at random according to data (code) of a corresponding safety program. The signature code is uniformly provided to the entire document related to the corresponding safety program.

Accordingly, as shown for example in FIG. 3, even in a case where a document generated from another safety program is mixed into a document generated from a safety program, the page having the document generated from the other safety program thereon can be reliably specified.

Support device 100 has a function of calculating an identification value according to data of the developed safety program in accordance with a function for calculating a random value with respect to an input, and a function of outputting a document related to the safety program. In addition, in the function of outputting, support device 100 provides the calculated identification value, as a signature code, to all pages of the document which are related to the safety program.

Preferably, the identification value used in the present embodiment is a value which is changed to a random and unrelated value by slight modification on the safety program, as described above. For example, a CRC (Cyclic Redundancy Check) code calculated in accordance with a predetermined generating polynomial, a data string in which multi-dimensional parities are sequentially arranged, or the like can be adopted. Alternatively, a hash value calculated using a unidirectional hash function or the like can be adopted.

<B. Configuration of Program Development Support Device>

Figure 4:
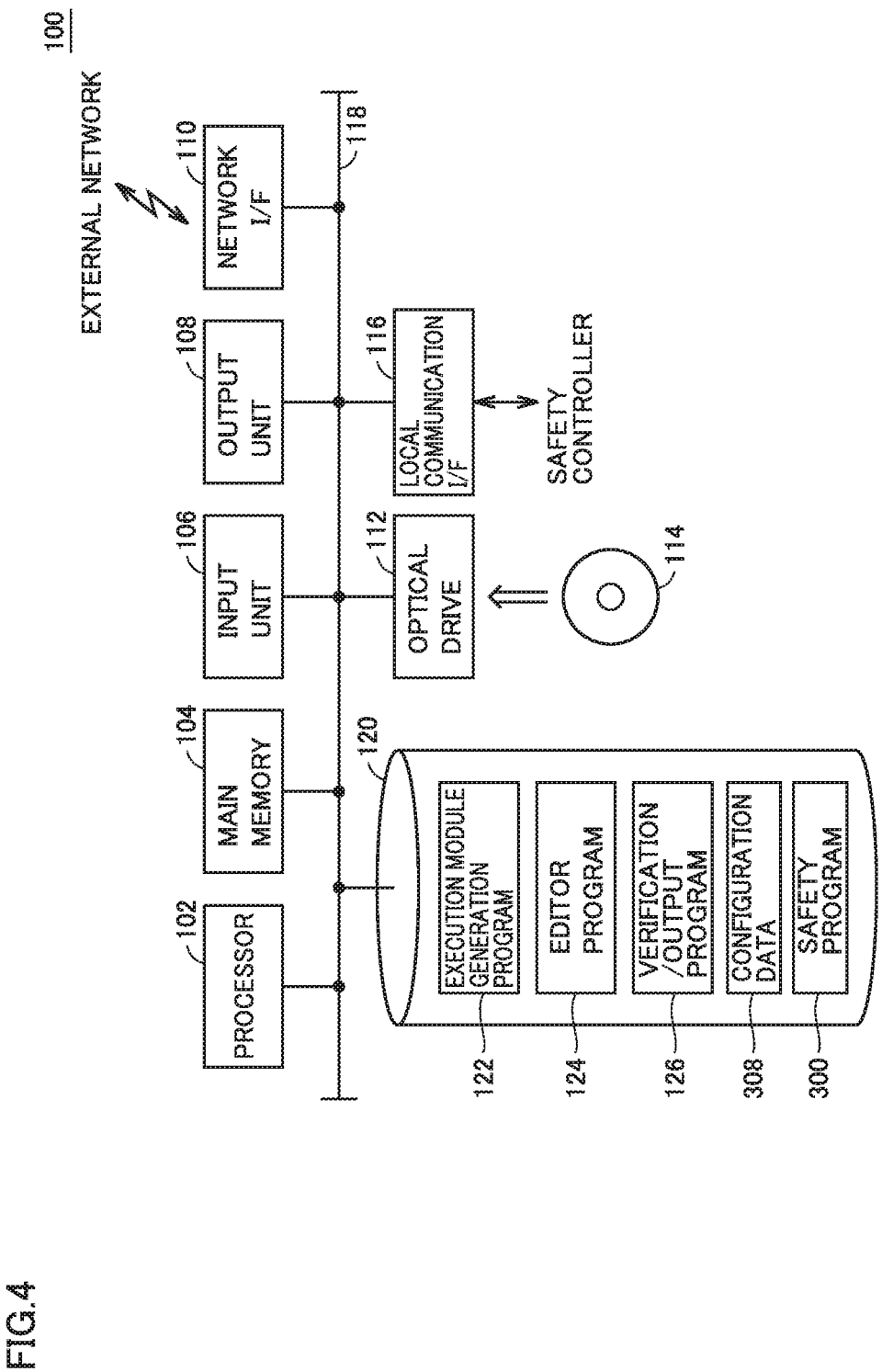
FIG. 4 is a schematic view showing an exemplary configuration of the support device in accordance with the present embodiment.

Next, a configuration of support device 100 having the function of outputting the document in accordance with the present embodiment will be outlined. FIG. 4 shows an exemplary configuration of support device 100 in accordance with the present embodiment.

Support device 100 in accordance with the present embodiment shown in FIG. 4 may be typically implemented by installing necessary software in a general purpose computer and executing it.

Specifically, support device 100 includes, as main components, a processor 102 for executing a program described later, a main memory 104 for providing a workspace for storing data necessary for processor 102 to execute the program, an input unit 106 for receiving user operation such as a keyboard and a mouse, an output unit 108 for outputting a processing result such as a display, various indicators, and a printer, a network interface (I/F) 110 for communicating with an external network, an optical drive 112, a local communication interface (I/F) 116 for communicating with the safety controller and the like, and an auxiliary storage device 120. These components are connected to each other via an internal bus 118 or the like to enable data communication therebetween.

Support device 100 has optical drive 112, which reads various programs from a computer-readable storage medium 114 such as an optical storage medium storing thereon a computer-readable program in a non-transitory manner (for example, a DVD (Digital Versatile Disc) or the like), and installs the read programs in auxiliary storage device 120 or the like. The function of outputting the document in accordance with the present embodiment may be provided as a portion of a development environment program which provides functions such as setting, programming, debugging and the like for the safety controller.

The various programs to be executed in support device 100 may be installed via computer-readable storage medium 114, or may be installed by being downloaded from a server device or the like on a network. Further, a program related to the function of outputting the document in accordance with the present embodiment may also be implemented by utilizing a portion of a module provided by an OS. In such a case, instead of distributing the entire software module necessary to implement the function of outputting the document in accordance with the present embodiment, only a portion thereof is distributed. It is clear that even such a case is encompassed in the technical scope of the present invention. Further, processing related to the function of outputting the document in accordance with the present embodiment may be implemented as a portion of another program or software.

Auxiliary storage device 120 is constituted of, for example, an HDD (Hard Disk Drive), an SSD (Solid State Drive), or the like, and stores the program to be executed by processor 102 and various data in a non-volatile manner. Specifically, auxiliary storage device 120 includes an execution module generation program 122 for generating a code (execution module) executable at the safety controller from the safety program (source code), an editor program 124 for creating and editing the safety program, and a verification/output program 126 for executing processing related to outputting of the document in accordance with the present embodiment. Further, auxiliary storage device 120 holds a source code of safety program 300 and configuration data 308.

Although the function of outputting the document in accordance with the present embodiment is implemented by the general purpose computer executing the program in FIG. 4, such a configuration may instead be entirely or partially implemented using a hard-wired circuit. For example, the function provided by processor 102 executing the various programs described above may be implemented using an ASIC (Application Specific Integrated Circuit) or an FPGA (Field-Programmable Gate Array).

<C. Processing of Generating Signature Code>

Next, processing of generating the signature code used for the function of outputting the document in accordance with the present embodiment will be described.

As a method for generating the signature code used for the function of outputting the document in accordance with the present embodiment, any algorithm can be adopted, as long as a function for calculating a random value with respect to an input is implemented. As described above, for example, a CRC code calculated by means of a predetermined generating polynomial, a hash value calculated by means of a unidirectional hash function, or the like can be adopted.

In the present embodiment, a CRC code calculated in accordance with a predetermined generating polynomial is output as an identification value. Since the CRC code is also used for other uses such as data transfer, a logic of calculating the CRC code has been already implemented on support device 100 in many cases. Accordingly, adopting the CRC code has an advantage that only a small amount of codes is required for an added logic when the signature code in accordance with the present embodiment is implemented.

It should be noted that, in the present application, the term "function" not only refers to a calculation formula for calculating a corresponding output value with respect to an input value in each case, but also can include a configuration using a table which defines beforehand the correspondence relation between an input value and an output value.

The safety program to be executed in the safety controller may be constituted of a combination of a plurality of source codes and configuration data (a group of setting values). On the other hand, it is only necessary that at least one signature code is provided to the document. Accordingly, the procedure for generating the signature code may be performed in two stages: generating a signature code for each data set; and generating a final signature code from the signature codes. It should be noted that the entire combination of the plurality of source codes and necessary configuration data (group of setting values) may also be referred to as a "project".

Figure 5:
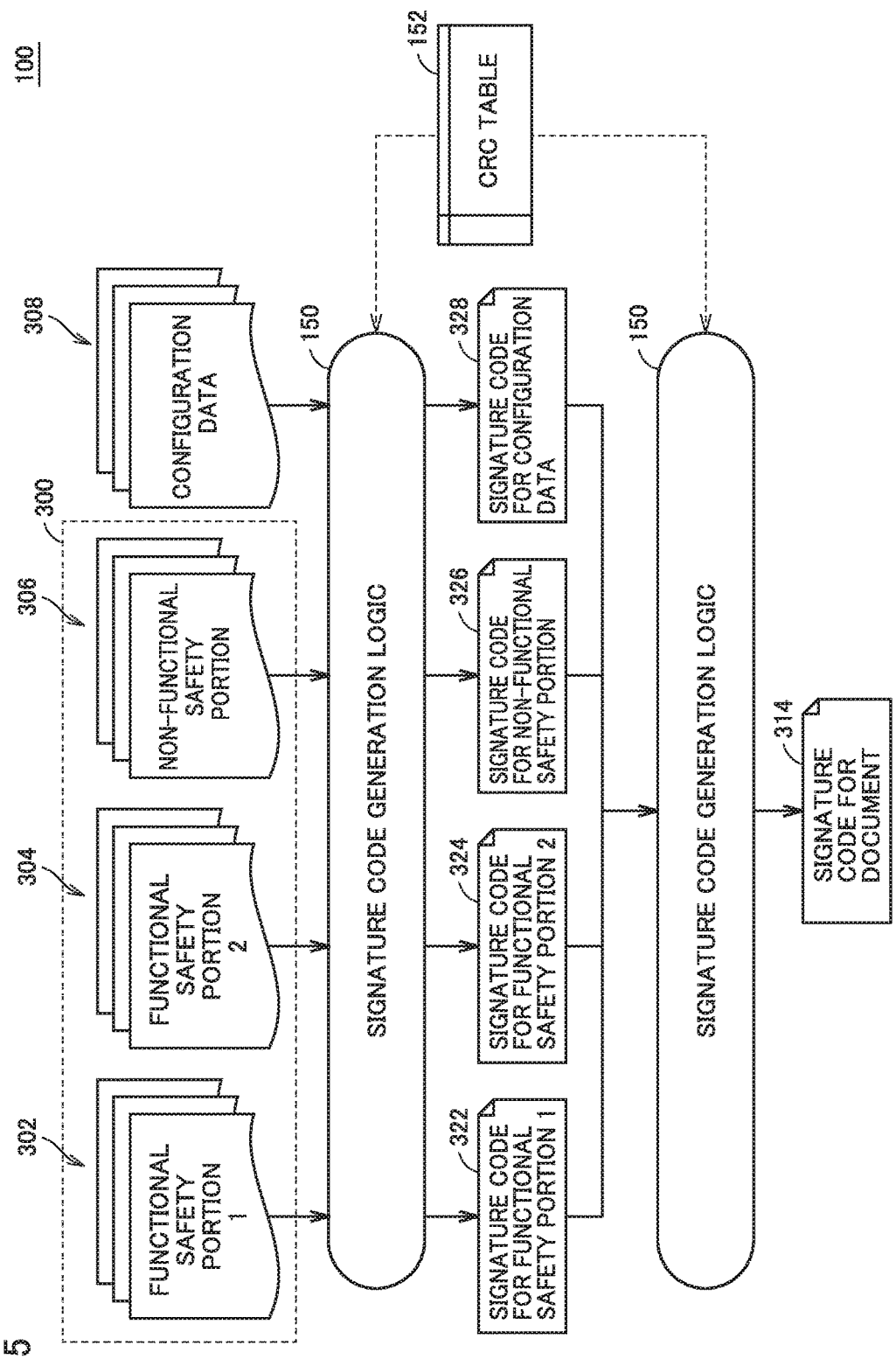
FIG. 5 is a schematic view illustrating processing of generating a signature code used for a function of outputting a document in accordance with the present embodiment.

Referring to FIG. 5, processing of generating the signature code used for the function of outputting the document in accordance with the present embodiment will be described. A signature code generation logic 150 shown in FIG. 5 is typically implemented by processor 102 of support device 100 executing verification/output program 126 (FIG. 4).

Safety program 300 is a user program to be executed in safety controller 200, and can include a logic for implementing functional safety and logics for implementing other functions. Hereinafter, the former logic will be referred to as a "functional safety portion", and the latter logics will be collectively referred to as a "non-functional safety portion".

The functional safety portion executes a predetermined logic in response to an input signal from a safety component during execution of the user program, and activates the target safety component or urgently stops equipment based on the result of executing the logic. The non-functional safety portion switches on equipment, or drives equipment to meet the purpose, in response to a certain input signal, for example.

Configuration data 308 includes setting information necessary for executing the safety program in the safety controller, and includes, for example, arrangement configuration of an I/O unit, network setting, assignment of a device to the I/O unit, assignment of a variable for use in the program for a signal assigned to the I/O unit, and the like.

In the first stage, from four data sets (a functional safety portion 302, a functional safety portion 304, a non-functional safety portion 306, and configuration data 308), four signature codes (a signature code 322 for a functional safety portion 1, a signature code 324 for a functional safety portion 2, a signature code 326 for the non-functional safety portion, and a signature code 328 for the configuration data) are generated, respectively, by signature code generation logic 150. Since a CRC code is adopted as a signature code in the example shown in FIG. 5, signature code generation logic 150 generates the respective signature codes, referring to a CRC table 152 prepared beforehand.

Furthermore, since the four signature codes are generated, signature code generation logic 150 generates a single signature code 314 for the document from these four signature codes. Then, generated signature code 314 for the document is provided to the document to be generated.

Thus, support device 100 calculates signature code 322, 324, 326, 328 (a first identification value) from each of a plurality of data generated by a development process, and calculates signature code 314 (a second identification value) provided to the document from a plurality of signature codes 322, 324, 326, 328.

By generating a single signature code through a plurality of stages in accordance with the procedure as described above, a signature code which reflects all data of safety program 300 (source code) and configuration data 308 necessary for executing safety program 300 can be generated. Thereby, the value of the generated signature code for the document is significantly changed even in a case where, for example, a portion of the configuration data is modified instead of the functional safety portion. Therefore, it can be recognized at a glance that the document related to the executed safety program differs from a previous document.

<D. Provision of Signature Code to Necessary Portion Only>

The safety controller as described above is a type of PLC (Programmable Logic Controller), and can execute not only the safety program as described above but also a general control program. In addition, the safety program may also include the non-functional safety portion as shown in FIG. 5. On the other hand, the signature code as described above fulfills its function as long as it is present at least for a portion related to the evaluation of functional safety. Therefore, the signature code may be provided to a portion related to functional safety (that is, some pages) only, instead of being provided to the entire output document (that is, all pages).

Figure 6:
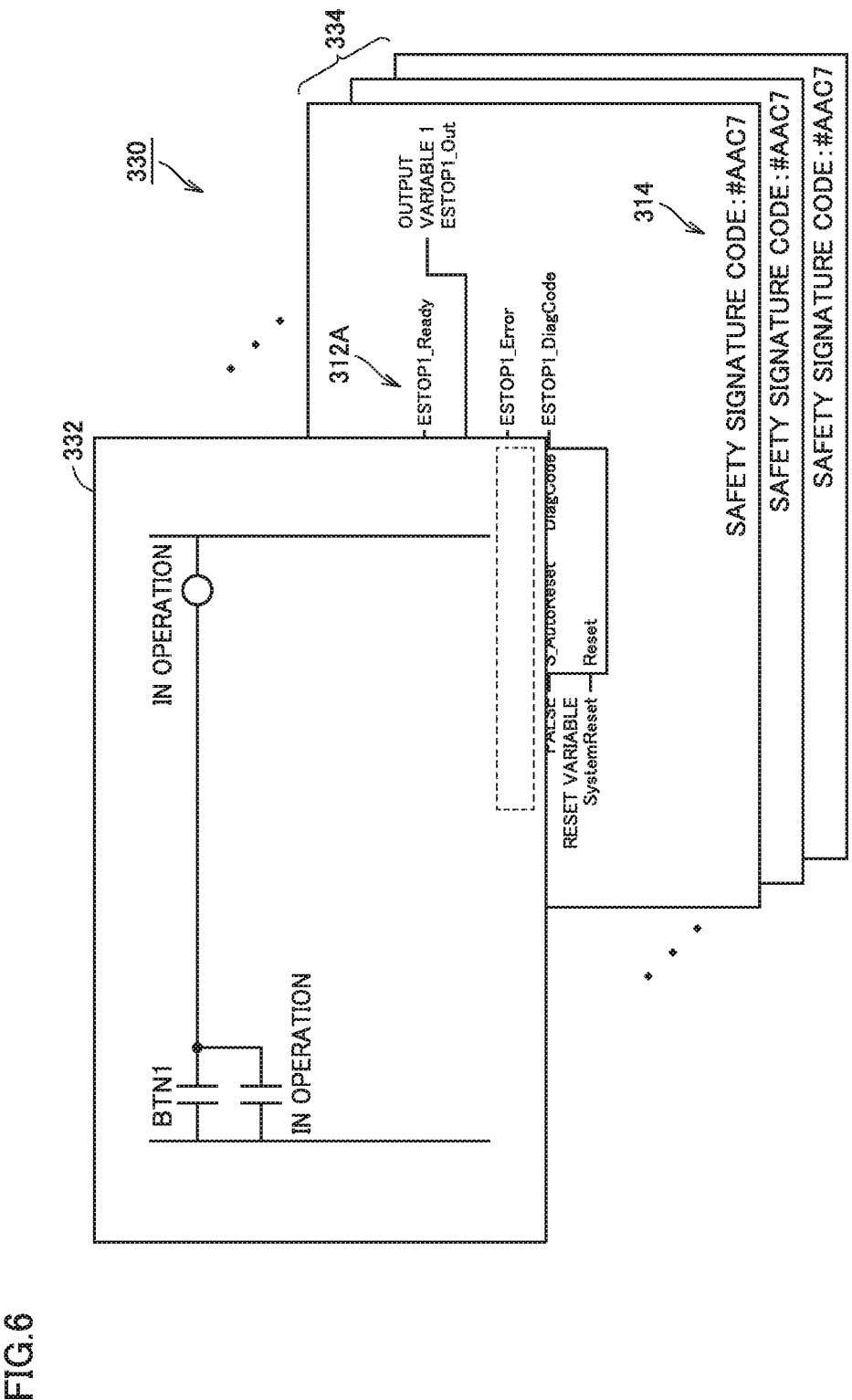
FIG. 6 is a schematic view showing another example of the document output from the support device in accordance with the present embodiment.

FIG. 6 shows another example of the document output from support device 100 in accordance with the present embodiment. Referring to FIG. 6, a document 330 is constituted of a combination of a document portion 332 corresponding to a non-functional safety portion and a document portion 334 corresponding to a functional safety portion. Signature code 314 for the document is provided to document portion 334 corresponding to the functional safety portion, whereas signature code 314 for the document is not present at a corresponding position in document portion 332 corresponding to the non-functional safety portion.

Thus, support device 100 provides the calculated signature code (identification value) to all pages related to functional safety, of pages constituting the output document.

In such a case where a document related to a safety program to be executed in a safety controller has a large number of pages, it may be considered as inefficient to print out all the pages of the document whenever a portion of the program is modified or altered. Therefore, the signature code is provided to at least pages related to functional safety to prevent page falsification or the like, whereas post page replacement or the like is permitted for other pages, securing functional safety as well as economy and rationality.

When the configuration of providing the signature code to only document portion 334 corresponding to the functional safety portion is adopted, it is preferable to exclude data of the non-functional safety portion from objects of calculation of the signature code. That is, the signature code provided to document portion 334 corresponding to the functional safety portion is preferably calculated from data of the functional safety portion only. More specifically, single signature code 314 for the document may be generated from only signature code 322 for functional safety portion 1 and signature code 324 for functional safety portion 2 shown in FIG. 5. By adopting such a configuration, even if an edit operation or the like is performed on the non-functional safety portion, the identical signature code is maintained unless the functional safety portion is modified, and thereby handling is facilitated.

It should be noted that a criterion for determining which portion of the output document should be regarded as the functional safety portion and the portion other than that should be regarded as the non-functional safety portion can be set beforehand. Generally, processing for obtaining an input signal from a safety component related to functional safety, a logic executed in response to the obtained input signal, processing for outputting a command to the safety component by reflecting the result of the logic, and the like are preferably regarded as belonging to the functional safety portion.

On the other hand, additional processing, for example, processing for collecting error logs or the like is preferably regarded as belonging to the non-functional safety portion.

<E. Function of Verification between Support Device and Safety Controller>

Next, a function of verifying the safety program which serves as a source for causing support device 100 to output the document will be described. As described with reference to FIG. 1, it is not possible to evaluate functional safety based on the document unless the contents of the document output from support device 100 are consistent with the contents of the safety program executed in safety controller 200. Accordingly, support device 100 in accordance with the present embodiment has a function of verifying the identicalness of the safety program between support device 100 and safety controller 200 as described below.

FIG. 7 is a sequence diagram showing a processing procedure for the function of verification in support device 100 in accordance with the present embodiment. Referring to FIG. 7, first, the user develops a safety program on support device 100 (step S10). The developed safety program is transferred to safety controller 200 (step S12). On this occasion, the safety program may be transferred to safety controller 200 with the source code being converted into an executable format.

Using support device 100, the user debugs the safety program executed on safety controller 200 (step S14). Although debugging of the safety program is performed on support device 100 before it is transferred to safety controller 200, some defects may be found only after the safety program is actually executed, and thus debugging is performed after the safety program is transferred to safety controller 200. Contents of this debugging may be automatically reflected in the safety program and the configuration data (group of setting values) held in support device 100.

After the completion of debugging, the user instructs to output a document, upon confirming the identicalness between the safety program held in support device 100 and the safety program to be executed in safety controller 200 (step S16). The identicalness is confirmed based on properties of the safety program, unit configuration, network configuration, communication item, task setting, variable setting, and the like.

Then, support device 100 generates a signature code based on the current safety program, related configuration data, and the like (step S18). In parallel, safety controller 200 also generates a signature code (step S20). A common logic is used for the generation of these signature codes. Then, safety controller 200 transmits the generated signature code (by the safety controller) to support device 100 (step S22).

Support device 100 compares the signature code (by the support device) generated by support device 100 with the signature code (by the safety controller) received from safety controller 200 to evaluate the identicalness therebetween (step S24). Only when the signature codes are identical, support device 100 outputs a document provided with the signature code (step S26).

Thus, support device 100 may output the document under a condition that the signature code (identification value) calculated from the safety program held in support device 100 is identical to the signature code (identification value) calculated from the safety program to be executed in safety controller 200.

Although FIG. 7 illustrates the configuration in which a signature code is generated in each of support device 100 and safety controller 200, the present invention is not limited thereto, and various methods may be adopted. For example, the safety program being executed may be transferred from safety controller 200 to support device 100, and support device 100 may generate a signature code for the safety program from safety controller 200. Alternatively, codes themselves of the safety programs may be compared, and a signature code may be generated only when the codes are consistent.

Thus, the document provided with the signature code may be output under a condition that the identicalness between the safety program held in support device 100 which outputs the document and the safety program to be executed in safety controller 200 is maintained.

It should be noted that a document may be output but without being provided with a signature code, until the identicalness between the safety programs is verified. In this case, the document not provided with the signature code cannot be used to verify functional safety. Through a series of processing as described above, the identicalness between the document output from support device 100 and the safety program executed in safety controller 200 can be secured.

<F. Advantages>

Since support device 100 in accordance with the present embodiment provides all pages of the output document which are related to the safety program, with the signature code, which is the identification value for securing the identicalness of the safety program, falsification such as replacement of some pages can be easily found, and stricter handling of the document related to the safety program executed in the safety controller can be achieved.

Further, support device 100 in accordance with the present embodiment can also be configured to provide the signature code at least only to pages of the document which are related to functional safety, and not to provide the signature code to other pages. By adopting the configuration in which the signature code is provided only to necessary pages as described above, it is possible to avoid an inefficient work of outputting the entire document again when the safety program is slightly modified or altered.

Although the embodiments of the present invention have been described, it should be understood that the embodiments disclosed herein are illustrative and non-restrictive in every respect. The scope of the present invention is defined by the scope of the claims, and is intended to include any modifications within the scope and meaning equivalent to the scope of the claims.

What is claimed is:

1. A program development support device for supporting development of a safety program to be executed in a safety controller, comprising:
a storage storing thereon computer-readable instructions, and
a processor, when computer-readable instructions are executed by the processor, configured to perform:
developing the safety program in response to user operation, the safety program including first logic as a functional safety portion;
calculating an identification value according to data of the developed safety program, by implementing a function for calculating a random value with respect to an input; and
outputting a document related to the safety program,
wherein said outputting a document comprises providing the calculated identification value to all pages of the document which are related to the first logic in the safety program, and
wherein said calculating an identification value includes:
calculating a first identification value from each of a plurality of data generated by said developing of the safety program, and
calculating a second identification value provided to the document from a plurality of the first identification values.

2. The program development support device according to claim 1, wherein said outputting a document further includes providing the calculated identification value to only those pages of the document related to the functional safety portion among all pages constituting the output document.

3. The program development support device according to claim 1, wherein said calculating an identification value includes outputting a cyclic redundancy check code calculated in accordance with a predetermined generating polynomial, as the identification value.

4. The program development support device according to claim 1, wherein said outputting a document further includes outputting the document under a condition that an identification value calculated from a safety program held in the program development support device is identical to the identification value calculated from the safety program to be executed in the safety controller.

5. A non-transitory storage medium storing thereon a computer-readable program development support program for supporting development of a safety program to be executed in a safety controller, the program development support program causing a computer to execute:
developing the safety program in response to user operation, the safety program including first logic as a functional safety portion;
calculating an identification value according to data of the developed safety program, by implementing a function for calculating a random value with respect to an input; and outputting a document related to the safety program,
wherein said outputting a document comprises providing the calculated identification value to all pages of the document which are related to the first logic in the safety program, and
wherein said calculating an identification value includes:
calculating a first identification value from each of a plurality of data generated by the developing, and
calculating a second identification value provided to the document from a plurality of the first identification values.

6. The non-transitory storage medium according to claim 5, wherein said outputting a document further includes providing the calculated identification value to only those pages of the document related to the functional safety portion among all pages constituting the output document.

7. The non-transitory storage medium according to claim 5, wherein said calculating an identification value includes outputting a cyclic redundancy check code calculated in accordance with a predetermined generating polynomial, as the identification value.

8. The non-transitory storage medium according to claim 5, wherein said outputting a document further includes outputting the document under a condition that an identification value calculated from a safety program held in the program development support device is identical to the identification value calculated from the safety program to be executed in the safety controller.

9. A program development support method to be executed in a device for supporting development of a safety program to be executed in a safety controller, comprising:
developing the safety program in response to user operation, the safety program including first logic as a functional safety portion;
calculating an identification value according to data of the developed safety program, by implementing a function for calculating a random value with respect to an input; and
outputting a document related to the first logic in the safety program,
wherein said outputting a document comprises providing the calculated identification value to all pages of the document which are related to the first logic in the safety program, and
wherein said calculating an identification value includes:
calculating a first identification value from each of a plurality of data generated by the developing, and
calculating a second identification value provided to the document from a plurality of the first identification values.

10. The program development support method according to claim 9, wherein said outputting a document further includes providing the calculated identification value to only those pages of the document related to the functional safety portion among all pages constituting the output document.

11. The program development support method according to claim 9, wherein said calculating an identification value includes outputting a cyclic redundancy check code calculated in accordance with a predetermined generating polynomial, as the identification value.

12. The program development support method according to claim 9, wherein said outputting a document further includes outputting the document under a condition that an identification value calculated from a safety program held in the program development support device is identical to the identification value calculated from the safety program to be executed in the safety controller.

* * * * *